United States Patent
Lee

(10) Patent No.: US 6,661,714 B2
(45) Date of Patent: Dec. 9, 2003

(54) INTEGRATED CIRCUIT MEMORY DEVICES HAVING SENSE AMPLIFIERS THEREIN THAT RECEIVE NOMINAL AND BOOSTED SUPPLY VOLTAGES WHEN ACTIVE AND METHODS OF OPERATING SAME

(75) Inventor: Jae-goo Lee, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/147,555

(22) Filed: May 17, 2002

(65) Prior Publication Data

US 2003/0002353 A1 Jan. 2, 2003

(30) Foreign Application Priority Data

Jun. 30, 2001 (KR) .................... 2001-0038815

(51) Int. Cl.[7] .............................................. G11C 7/00
(52) U.S. Cl. .................... 365/189.11; 365/205
(58) Field of Search ............................ 365/189.11, 205

(56) References Cited

U.S. PATENT DOCUMENTS

| | | | | |
|---|---|---|---|---|
| 5,127,739 A | * | 7/1992 | Duvvury et al. ....... | 365/189.11 |
| 5,602,785 A | * | 2/1997 | Casper .................. | 365/189.11 |
| 5,646,880 A | * | 7/1997 | Yuh ...................... | 365/149 |
| 5,768,201 A | * | 6/1998 | Oh ........................ | 365/205 |
| 6,128,235 A | * | 10/2000 | Jung ..................... | 365/205 |
| 6,522,593 B2 | * | 2/2003 | Kim et al. ............. | 365/205 |

OTHER PUBLICATIONS

U.S. Application No. 10/136,606, Filed May 1, 2002, *Semiconductor Memory Devices and Methods Including Coupling and/or Floating Isolation Control Signal Lines*, Attorney Docket No. 5649–964.

* cited by examiner

Primary Examiner—Richard Elms
Assistant Examiner—Tuan T. Nguyen
(74) Attorney, Agent, or Firm—Myers Bigel Sibley & Sajovec

(57) ABSTRACT

Integrated circuit devices provide supplemental pull-up drive currents to one or more sense amplifiers therein during operations (e.g., read operations) to sense and amplify differential signals established across inputs of the sense amplifiers. These additional pull-up drive currents are provided to improve the timing characteristics of the sense amplifiers by making them less susceptible to degraded performance that may be caused by insufficiently high internal voltages.

27 Claims, 7 Drawing Sheets

INTEGRATED CIRCUIT MEMORY DEVICES HAVING SENSE AMPLIFIERS THEREIN THAT RECEIVE NOMINAL AND BOOSTED SUPPLY VOLTAGES WHEN ACTIVE AND METHODS OF OPERATING SAME

RELATED APPLICATION

This application claims priority to Korean Patent Application No. 2001-38815, filed on Jun. 30, 2001, the disclosure of which is hereby incorporated herein by reference.

FIELD OF THE INVENTION

The present invention relates to semiconductor memory devices, and more particularly, to semiconductor memory devices having sense amplifiers therein that amplify differential input signals.

BACKGROUND OF THE INVENTION

Semiconductor devices have been continuously developed to increase their capacity and speed and lower their power consumption. To realize low power consumption, a dynamic random access memory (DRAM) device may use a bit-line sense amplifier that is shared by two neighboring memory cell array blocks and an internal memory cell array power supply voltage as a power supply voltage of the shared bit-line sense amplifier. The internal memory cell array power supply voltage is a voltage that is typically reduced from an external power supply voltage. If the internal memory cell array power supply voltage is excessively reduced, the operational features of the bit-line sense amplifier may be degraded.

FIG. 1 shows a memory cell array of a conventional DRAM and FIG. 2 is a waveform diagram illustrating the operation of a sense amplifier in the conventional DRAM shown in FIG. 1. Referring to FIG. 1, bit-line sense amplifiers S1 through S4 are shared by two neighboring memory cell arrays 11 and 13. Pairs of bit-lines BL0i/BL0Bi through BL3i/BL3Bi that are connected to a first memory cell array block 11 are initially equalized to a level Vb1 by equalization circuits E1 through E4, and other pairs of bit-lines BL0j/BL0Bj through BL3j/BL3Bj that are connected to a second memory cell array block 13 are initially equalized to the level Vb1 by equalization circuits E5 through E8.

In FIG. 2, first and second isolation control signals PISOi and PISOj initially rise to the level of an external power supply voltage Vdd. Thereafter, the first isolation control signal PISOi rises to the level of a boosted voltage Vpp and the second isolation control signal PISOj falls to the level of the ground voltage Vss. As a result, pairs of first isolation transistors T1 through T8 are turned on, whereas pairs of second isolation transistors T9 through T16 are turned off. That is, the first memory cell array block 111 is selected, but the second memory cell array block 13 is not selected.

Then, a word line WL of a row of memory cells of the first memory cell array 11 reaches the boosted voltage level Vpp, a sense amplifier control signal LAPG reaches logic a "low" level and an inverted sense amplifier control signal LANG rises to a logic "high" level. As a result, sense amplifiers S1 through S4 begin to operate. That is, a first switch SW1 is turned on to provide pull-up current to a power supply voltage node LA of the sense amplifiers S1 through 54 by connecting the memory cell array power supply voltage V-array to the node LA. A second switch SW2 is also turned on to provide a ground voltage node LAB with the ground voltage VSS. The sense amplifiers S1 through S4 amplify data in the form of differential signals established across the pairs of the bit-lines BL0i/BL0Bi through BL3i/BL3Bi connected to the first memory cell array block 11.

However, according to the operation of the sense amplifier shown FIG. 2, the pairs of the first isolation transistors T1 through T8 are turned on earlier as expected by the first isolation control signal PISOi rising almost to the Vpp level during the initial operation of the sense amplifiers S1 through S4. Thus, a load of the pairs of bit-lines BL0i/BL0Bi through BL3i/BL3Bi connected to the first memory cell array block II is increased. This increased loading degrades the operational features of the sense amplifiers S1 through S4 and, further, reduces amplification speed.

FIG. 3 is a waveform diagram illustrating another operation of the sense amplifier in the conventional DRAM shown in FIG. 1. Here, the sense amplifier has improved operational features compared to that shown in FIG. 2. Referring to FIG. 3, the first and second isolation control signals PISOi and PISOj initially rise to the external power supply voltage level Vdd. Then, the first isolation control signal PISOi is kept at the outside power supply voltage Vdd level and the second isolation control signal PISOj falls to the ground voltage Vss level during the initial operation of the sense amplifiers S1 through S4. Thereafter, the first isolation control signal PISOi rises to the boosted voltage level Vpp during the middle part of the operation of the sense amplifiers S1 through S4.

According to the operation of the sense amplifier shown FIG. 3, the pairs of the first isolation transistors T1 through T8 have lower conductivity because the first isolation control signal PISOi has a lower level of Vdd and, therefore, a load on the pairs of the bit-lines BL0i/BL0Bi through BL3i/BL3Bi connected to the first memory cell array block 11 is decreased. As a result, the amplification speed of the sense amplifiers S1 through S4 is increased.

However, if the memory cell array power supply voltage Varray provided to the sense amplifiers S1 through S4 is comparatively high, data values which are achieved by sharing charge between a memory cell and bit line cannot be satisfactorily transmitted to the sense amplifiers S1 through S4. To prevent this, the memory cell array power supply voltage Varray must be lowered. However, in this case, the operational features of the sense amplifiers S1 through S4 may deteriorate.

SUMMARY OF THE INVENTION

Integrated circuit devices according to embodiments of the present invention provide supplemental pull-up drive currents to one or more sense amplifiers therein during operations (e.g., read operations) to sense and amplify differential signals established across inputs of the sense amplifiers. These additional pull-up drive currents are provided to improve the timing characteristics of the sense amplifiers by making them less susceptible to degraded performance that may be caused by insufficiently high internal voltages.

In particular, first embodiments of the present invention include integrated circuit devices having preferred control circuitry therein. This control circuitry drives a power supply terminal of a differential sense amplifier with a plurality of pull-up drive currents. These pull-up drive currents are derived from a corresponding plurality of signal lines that are each electrically coupled to the power supply terminal of the differential sense amplifier. These signal lines are driven at different positive voltage levels during sense and amplify time intervals (i.e., when the sense amplifier is active).

Additional embodiments of the present invention include integrated circuit memory devices having multiple banks of memory arrays therein. These memory arrays may be coupled to a bank of sense amplifiers, with each sense amplifier having first and second inputs electrically coupled to a pair of differential signal lines. A pull-up control circuit is also provided. The pull-up control circuit provides pull-up drive currents in parallel from first and second voltage supply sources having different magnitudes to a power supply terminal of the sense amplifier when the sense amplifier is amplifying a differential input signal established across the first and second inputs. Memory devices according to this embodiment may also include first and second isolation transistors having first and second gate electrodes electrically coupled to an isolation control signal line. Furthermore, the pull-up control circuit may include a first MOS transistor (e.g., NMOS or PMOS transistor) having a first current carrying terminal (source/drain) electrically coupled to the isolation control signal line and a second current carrying terminal (source/drain) electrically coupled to the power supply terminal of the sense amplifier. The first and second isolation transistors also have first current carrying terminals that are electrically coupled to the pair of differential signal lines, which are provided to inputs of the sense amplifier. The pull-up control circuit further includes a second MOS transistor (e.g., PMOS transistor) having a first current carrying terminal (source/drain) electrically coupled to a memory array power supply line (e.g., Varray) and a second current carrying terminal (source/drain) electrically coupled to the power supply terminal of the sense amplifier. According to a preferred aspect of this embodiment, a magnitude of the first voltage supply source is greater than a magnitude of the second voltage supply source.

Integrated circuit memory devices may also include a memory cell array block, a pair of bit lines connected to the memory cell array block, a sense amplifier for sensing and amplifying a voltage difference between the pair of the bit lines, a pair of isolation transistors for connecting the pair of bit lines and the sense amplifiers or isolating them from each other in response to a isolation control signal, a first switch for transmitting a memory cell array power supply voltage to a power supply voltage node of the sense amplifiers in response to a sense amplifier control signal, and a second switch for transmitting the isolation control signal to the power supply voltage node of the sense amplifier in response to a predetermined control signal. The memory cell array power supply voltage and the isolation control signal are used as power supply voltages of the sense amplifiers.

Still further memory devices may include a first memory cell array block, a pair of first bit lines connected to the first memory cell array block, a second memory cell array block, a pair of second bit lines connected to the second memory cell array block, a first equalization unit for equalizing the pair of first bit lines in response to the first equalization signal, a second equalization unit for equalizing the pair of second bit lines in response to the second equalization signal, a sense amplifier for sensing and amplifying a voltage difference between the pair of the first bit lines or the pair of the second bit lines, a pair of first isolation transistors for connecting the pair of first bit lines and the sense amplifier or separating the pairs of first bit lines from the pair input by the sense amplifier in response to a first isolation control signal, a pair of second isolation transistors for connecting the pair of the second bit lines and the sense amplifier or isolating them from each other in response to a second isolation control signal, a first switch for transmitting the memory cell array power supply voltage to the power supply voltage node of the sense amplifier in response to the sense amplifier control signal, a second switch for transmitting the first isolation control signal to the power supply voltage node of the sense amplifier in response to a first control signal, a third switch for transmitting the second isolation control signal to the power supply voltage node of the sense amplifier in response to the second control signal, and a control signal generation circuit for generating the first and second control signals in response to the sense amplifier control signal, the inverted signal of the sense amplifier control signal and the first and second equalization signals.

It is preferable that the control signal generation circuit includes a first control signal generation circuit for generating the first control signal in response to the sense amplifier control signal, the inverted signal of the sense amplifier control signal and the second equalization signal, and a second control generation circuit for generating the second control signal in response to the sense amplifier control signal, the inverted signal of the sense amplifier control signal and the first equalization signal. The second and third switches preferably include nMOS transistors.

BRIEF DESCRIPTION OF THE DRAWINGS

The above objective and advantages of the present invention will become more apparent by describing in detail a preferred embodiment thereof with reference to the attached drawings in which.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. Signal lines and signals thereon may be referred to by the same reference names and characters.

Figure 1:
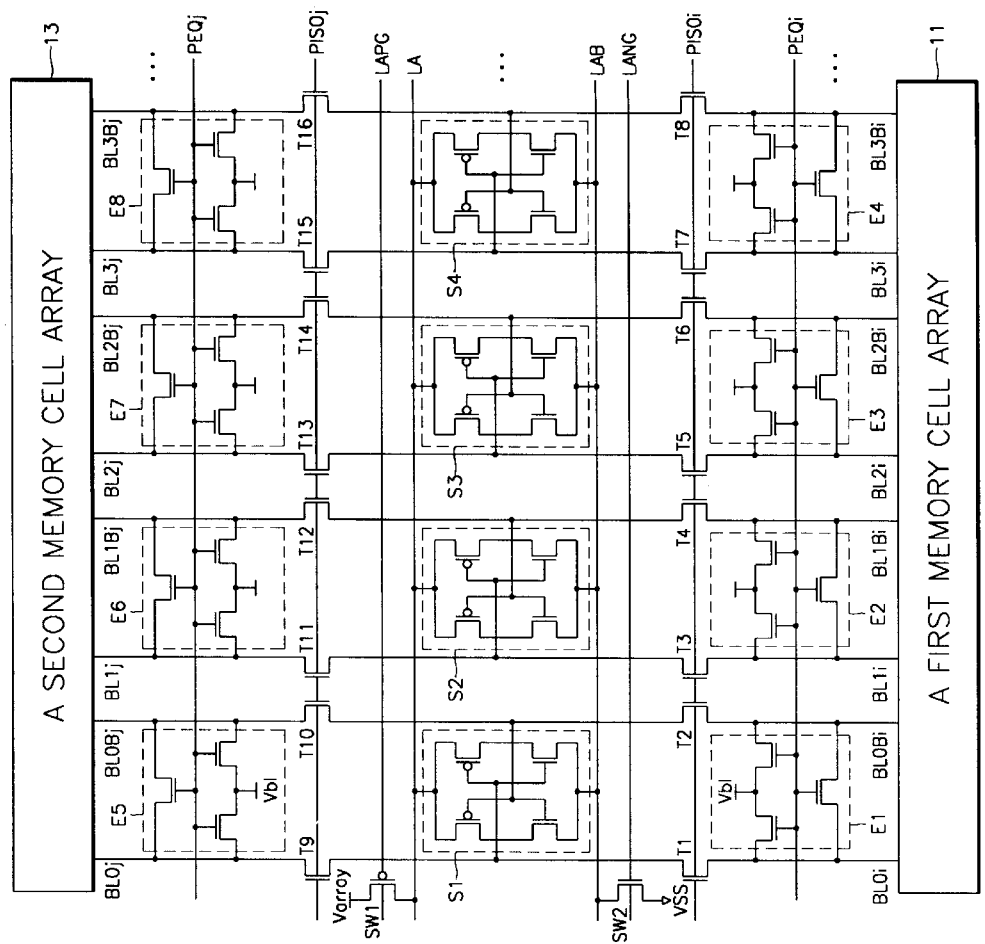
FIG. 1 is an electrical schematic of a conventional DRAM device.
Figure 2:
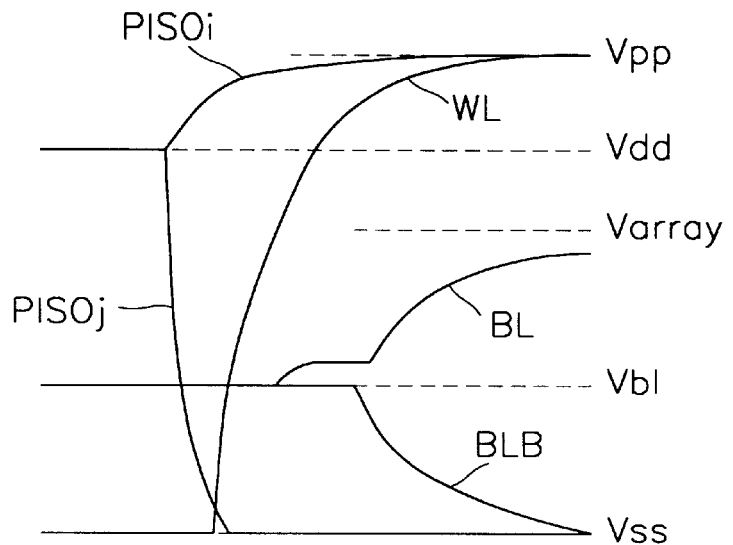
FIGS. 2 and 3 are waveform diagrams illustrating operations of a sense amplifier of the conventional DRAM device shown in FIG. 1.
Figure 3:
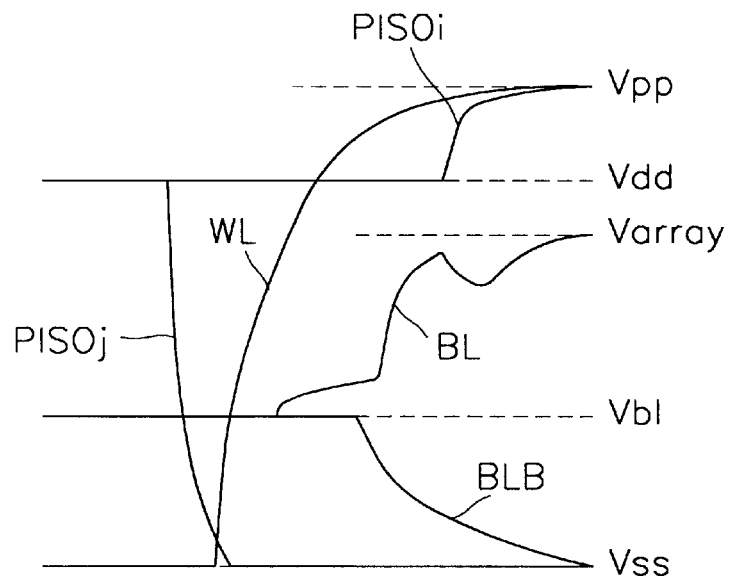
Figure 4:
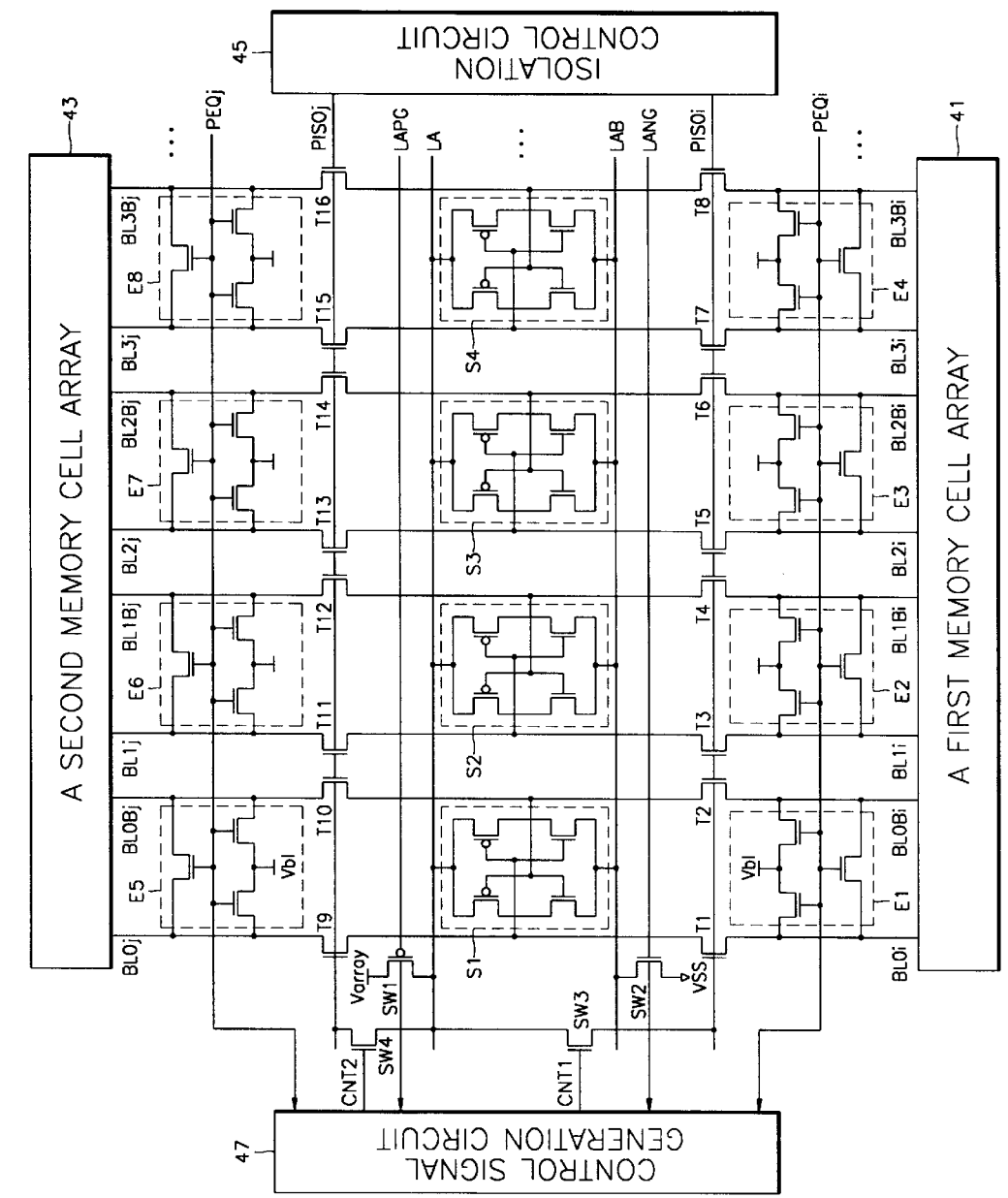
FIG. 4 is an electrical schematic of a DRAM device according to an embodiment of the present invention.

FIG. 4 shows a DRAM device having two memory cell array blocks 41 and 43. The DRAM device includes a first memory cell array block 41, pairs of first bit-lines BL0*i*/BL0B*i* through BL3*i*/BL3B*i* connected to the first memory cell array block 41, and first equalization circuits E1 through E4 for equalizing the pairs of the first bit-lines in response to a first equalization signal PEQi. Also, the DRAM device includes a second memory cell array block 43, pairs of second bit-lines BL0j/BL0Bj through BL3j/BL3Bj connected to the second memory cell array block 43 and second equalization circuits E5 through E8 for equalizing the pairs of the second bit-lines in response to a second equalization signal PEQj. Further, the DRAM device includes pairs of first isolation transistors T1 through T8, pairs of second isolation transistors T9 through T16, an isolation control circuit 45, shared sense amplifiers S1 through S4, a first switch SW1 and a second switch SW2.

The pairs of first isolation transistors T1 through T5 respond to the first isolation control signal PISOi and connect the pairs of the first bit-lines BL0i/BL0Bi through BL3i/BL3Bi to the shared sense amplifiers S1 through S4 or electrically isolate them from each other. The pairs of the second isolation transistors T9 through T16 respond to the second isolation control signal PISOj and connect the pairs of the second bit-lines BL0j/BL0Bj through BL3j/BL3Bj to the shared sense amplifiers S1 through S4 or electrically isolate them from each other. The pairs of the isolation transistors T1 through T16 are formed with nMOS transistors. In the meantime, the isolation control circuit 45 generates the first and second isolation control signals PISOi and PISOj. The construction and operation of an exemplary isolation control circuit 45 will be described in detail with reference to FIGS. 7 and 8.

The first switch SW1 is composed of a pMOS transistor and transmits the memory cell array power supply voltage Varray to the power supply voltage node LA of the sense amplifiers S1 through S4 in response to the sense amplifier control signal LAPG. The second switch SW2 is illustrated as an nMOS transistor and transmits the ground voltage VSS to the ground voltage node LAB of the sense amplifiers S1 through S4 in response to the inverted signal LANG of the sense amplifier control signal LAPG. The memory cell array power supply voltage Varray is typically a voltage that is reduced from an exterior power supply voltage Vdd that is supplied to the DRAM device.

The shared sense amplifiers S1 through S4 sense and amplify a voltage difference between the respective pairs of the first bit-lines or the respective pairs of the second bit-lines. Specifically, when the first isolation control signal PISOi is at the logic "low" level and the second isolation control signal PISOj is at the logic "high" level, the pairs of the first isolation transistors T1 through T8 are turned off and the pairs of the second isolation transistors T9 through T16 are turned on. As a result, the pairs of the first bit-lines BL0i/BL0Bi through BL3i/BL3Bi and the shared sense amplifiers S1 through S4 are separated from each other, whereas the pairs of the second bit-lines BL0j/BL0Bj through BL3j/bL3Bj and the shared sense amplifiers S1 through S4 are connected to each other. Thereafter, the shared sense amplifiers S1 through S4 sense a voltage difference between the respective pairs of the second bit lines BL0j/BL0Bj through BL3j/BL3Bj and amplify the same. The voltage difference is established across the bit lines using conventional reading operations that follow equalization of the bit lines to a voltage level of Vb1 when the first equalization circuits E1–E4 are enabled. The construction and operation of the equalization circuits is well known to those skilled in the art and need not be described further herein.

The DRAM according to the present invention further includes a third switch SW3 for transmitting the first isolation control signal PISOi to the power supply node LA of the sense amplifiers S1 through S4 in response to a first control signal CNT1, a fourth switch SW4 for transmitting the second isolation control signal PISOj to the power supply node LA of the sense amplifiers S1 through S4 in response to a second control signal CNT2, and a control signal generation circuit 47 for generating the first and second control signals CNT1 and CNT2. Here, nMOS transistors are used for the third and fourth switches SW3 and SW4, but pMOS transistors may also be used and may be preferred depending on the application.

The control signal generation circuit 47 generates the first and second control signals CNT1 and CNT2 in response to the sense amplifier control signal LAPG, the inverted signal LANG of the sense amplifier control signal and the first and second equalization signals PEQi and PEQi. The construction and operation of an exemplary control signal generation circuit 47 will be described in detail with reference to FIGS. 5 and 6.

The DRAM device according to the present invention uses any one of the first and second isolation control signals PISOi and PISOj and the memory cell array power supply voltage Varray as power supply voltages. For instance, when the first control signal CNT1 is the logic "high" level, the third switch SW3 is turned on and the first isolation control signal PISOi is used together with the memory cell array power supply voltage Varray as power supply voltages of the sense amplifiers S1 through S4. On the other hand, if the second control signal CNT2 is the logic "high" level, the fourth switch SW4 is turned on and the second isolation control signal PISOj and the memory cell array power supply voltage Varray are used as power supply voltages of the sense amplifiers S1 through S4. Thus, switches SW4 and SW3 can be used to provide additional pull-up drive current to node LA of the sense amplifiers S1–S4.

Figure 5:
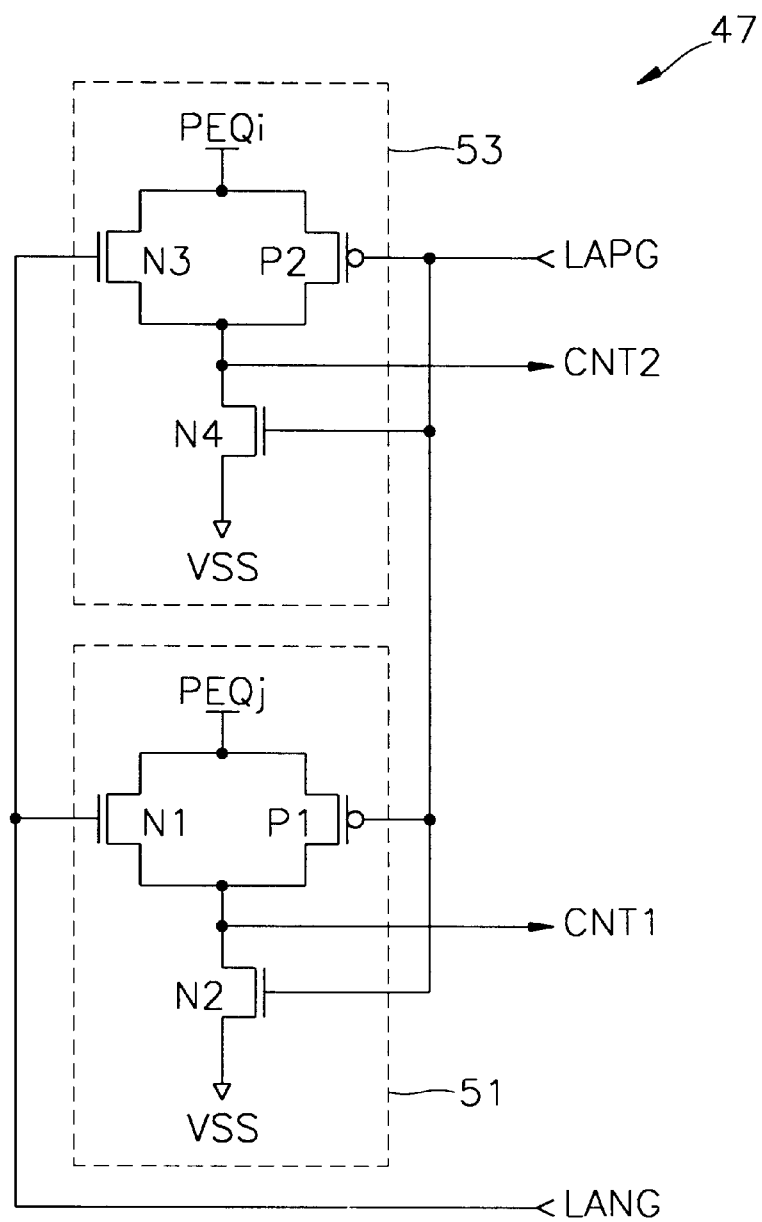
FIG. 5 is an electrical schematic of the control signal generation circuit shown in FIG. 4.

FIG. 5 shows a schematic diagram of the control signal generation circuit 47 shown in FIG. 4. Referring to FIG. 5, the control signal generation signal 47 includes a first control signal generation circuit 51 for generating the first control signal CNT1 in response to the sense amplifier control signal LAPG, the inverted signal LANG of the sense amplifier control signal and the second equalization signal PEQj, and a second control signal generation circuit 53 for generating the second control signal CNT2 in response to the sense amplifier control signal LAPG, the inverted signal LANG of the sense amplifier control signal and the first equalization signal PEQi. The first control signal generation circuit 51 includes a pMOS transistor P1, an nMOS transistor N1 and an nMOS transistor N2, connected as illustrated. In the pMOS transistor P1, the second equalization signal PEQj is applied to a source, the sense amplifier control signal LAPG is applied to the gate and the drain is connected to an output node for generating the first control signal CNT1. In the nMOS transistor N1, the drain is connected to the second equalization circuit PEQj, the inverted signal LANG of the sense amplifier control signal is applied to the gate and the source is connected to the output node. Also, in the nMOS transistor N2, the drain is connected to the output node, the sense amplifier control signal LAPG is applied to the gate and the ground voltage Vss is applied to the source.

The second control signal generation circuit 53 includes a pMOS transistor P2, an nMOS transistor N3 and an nMOS transistor N4. In the pMOS transistor P2, the first equalization signal PEQi is applied to its source, the sense amplifier control signal LAPG is applied to its gate and its drain is connected to an output node for generating the second control signal CNT2. In the nMOS transistor N3, the first equalization signal PEQi is applied to its drain, the inverted signal LANG of the sense amplifier control signal is applied to its gate and the source is connected to the output node (i.e., signal line CNT2). In the nMOS transistor N4, the source is connected to the output node, the sense amplifier control signal LAPG is applied to the gate and the ground voltage Vss is applied to the source.

Figure 6:
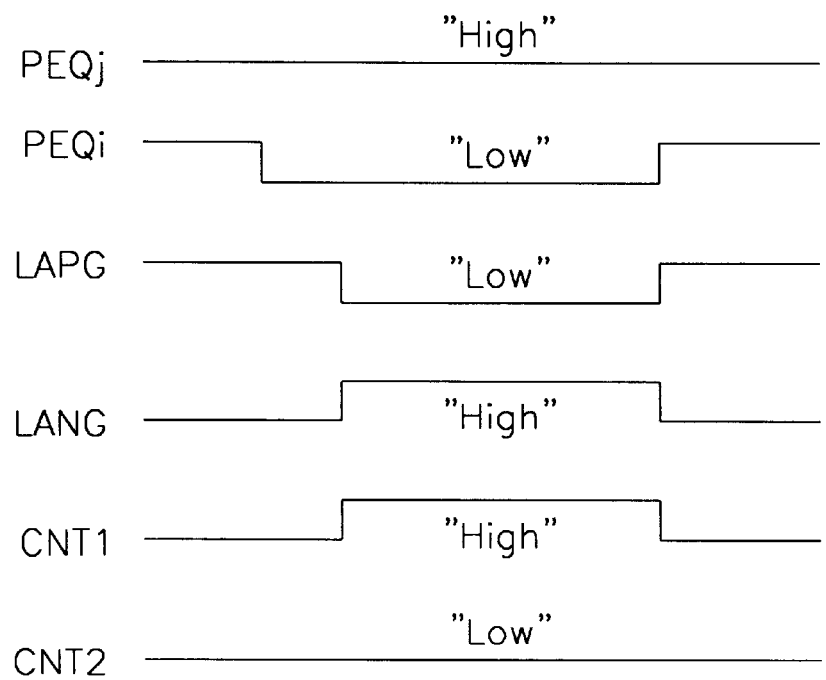
FIG. 6 is a timing diagram that illustrates operation of the control signal generation circuit of FIG. 5.

FIG. 6 shows an example of the timing of the signals associated with the circuit of FIG. 5. Referring to FIG. 6, the operations of the circuits shown in FIGS. 5 and 4 will now be described in more detail. When the equalization circuits E1–E8 are active, the first and second equalization signals PEQi and PEQj are at the logic "high" level, the sense amplifier control signal LAPG is at the logic "high" level and the inverted signal LANG of the sense amplifier control signal is at the logic "low" level. Then, the pMOS transistor P1, the pMOS transistor P2, the nMOS transistor N1 and the nMOS transistor N3 are turned off, whereas the nMOS transistor N2 and the nMOS transistor N4 are turned on. Thus, the first and second control signals CNT1 and CNT2 are both logic "low".

As a result, the third and fourth switches SW3 and SW4 shown in FIG. 4 are turned off. Also, the sense amplifier control signal LAPG is logic "high" and the inverted signal of the sense amplifier control signal is logic "low", and therefore, the first and second switches SW1 and SW2 are turned off, so that the sense amplifiers S1 through S4 shown in FIG. 4 do not function.

Next, the second equalization signal PEQj is maintained at the logic "high" level, the first equalization signal PEQi is switched to the logic "low" level, the sense amplifier control signal LAPG is switched to the logic "low" level and the inverted signal LANG of the sense amplifier control signal is switched to the logic "high" level. As a result, the pMOS transistor P1, the pMOS transistor P2, the nMOS transistor N1 and the nMOS transistor N3 are turned on, whereas the nMOS transistor N2 and the nMOS transistor N4 are turned off. Then, the logic "high" value of the second equalization signal PEQj is transmitted via the pMOS transistor P1 and the NMOS transistor N1 and the first control signal CNT1 becomes logic "high". Further, the logic "low" value of the first equalization signal PEQi is transmitted through the pMOS transistor P2 and the nMOS transistor N3 and the second control signal CNT2 becomes a logic "low" level.

As a result, the third switch SW3 shown in FIG. 4 is turned on and the fourth switch SW4 is turned off. At this time, since the sense amplifier control signal LAPG is at the logic "low" level and the inverted signal LANG of the sense amplifier control signal is at the logic "high" level, the first and second switches SW1 and SW2 are turned on. Therefore, the first isolation control signal PISOi is transmitted to the power supply voltage node LA of the sense amplifiers S1 through S4 through the third switch SW3 and the memory cell array power supply voltage Varray is transmitted to the power supply voltage node LA of the sense amplifiers S1 through S4 through the first switch SW1. That is, the first isolation control signal PISOi and the memory cell array power supply voltage Varray are both used as separate power supply voltages of the sense amplifiers S1 through S4.

In the meantime, if the second equalization signal PEQj is logic "low" and the first equalization signal PEQi is logic "high", the first control signal CNT1 is logic "low" and the second control signal CNT2 is logic "high". As a result, the third and fourth switches SW3 and SW4, respectively, shown in FIG. 4 are turned off and on. Then, the second isolation control signal PISOj is transmitted to the power supply voltage node LA of the sense amplifiers S1 through S4 through the fourth switch SW4 and the memory cell array power supply voltage Varray is transmitted to the power supply voltage node LA of the sense amplifiers S1 through S4 through the second switch SW2. That is, the second isolation control signal PISOj and the memory cell array power supply voltage Varray are both used as separated power supply voltages of the sense amplifiers S1 through S4.

Here, the first and second isolation signals PISOi and PISOj are generated by the isolation control circuit 45 positioned in the peripheral circuit domain. The circuit diagram of the isolation control circuit 45 shown in FIG. 4 is illustrated in FIG. 7.

Figure 7:
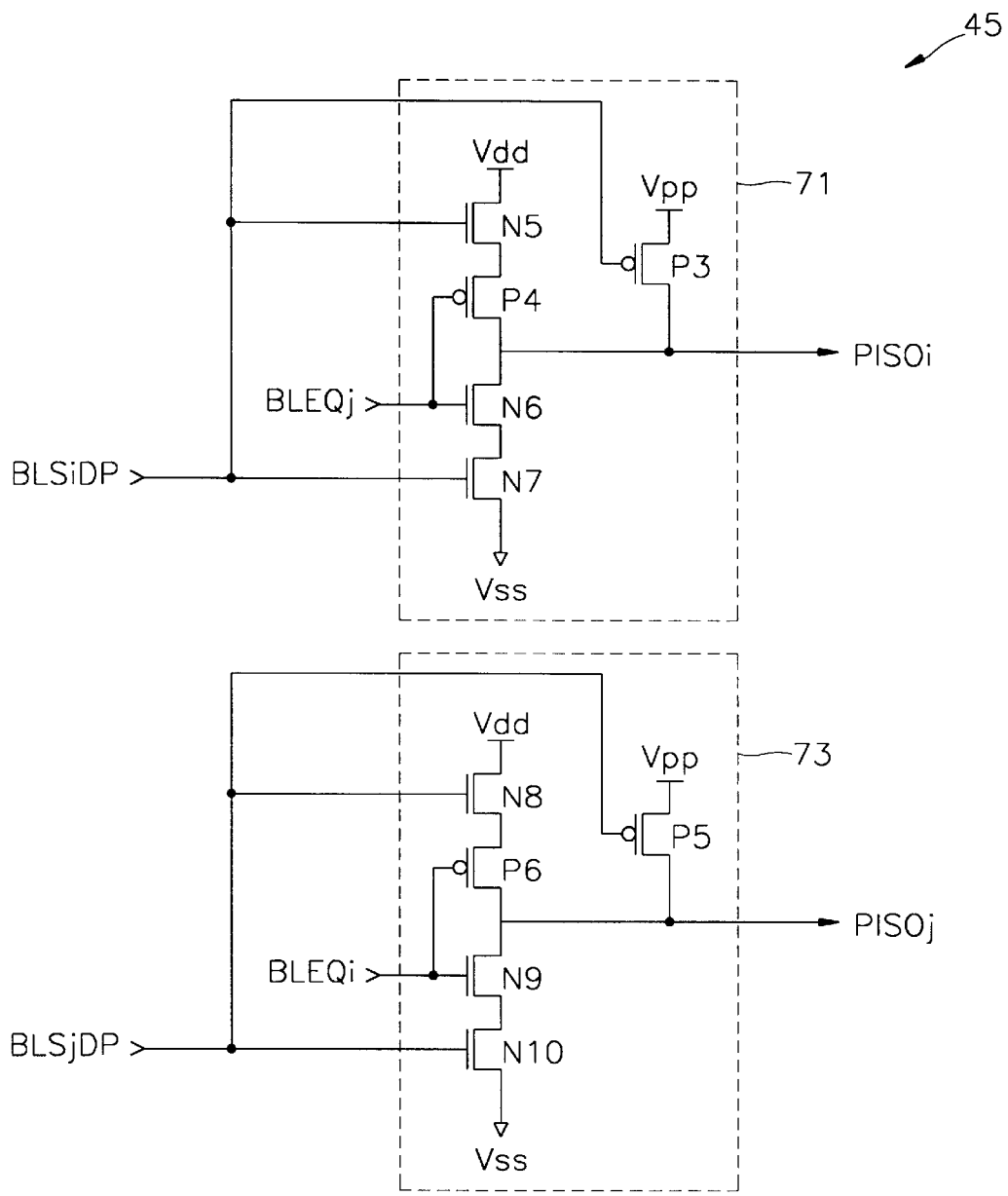
FIG. 7 is an electrical schematic of the isolation control circuit of FIG. 4.

Referring to FIG. 7, the isolation control circuit 45 includes a first isolation control generation circuit 71 for generating the first isolation control signal PISOi in response to control signals BLEQj and BLSiDP and a second isolation control signal generation circuit 73 for generating the second isolation control signal PISOj in response to control signals BLEQi and BLSjDP.

The first isolation control signal generation circuit 71 includes pMOS transistors P3 and P4 and nMOS transistors N5 through N7, and the second isolation control signal generation signal 73 includes pMOS transistors P5 and P6 and nMOS transistors N8 through N11.

Figure 8:
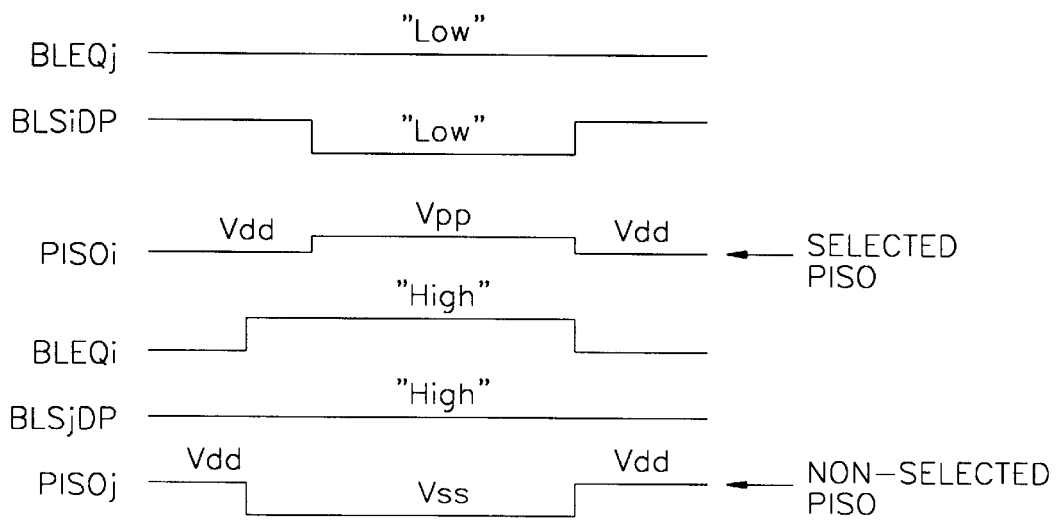
FIG. 8 is a timing diagram that illustrates operation of the isolation control circuits of FIG. 7.
Figure 9:
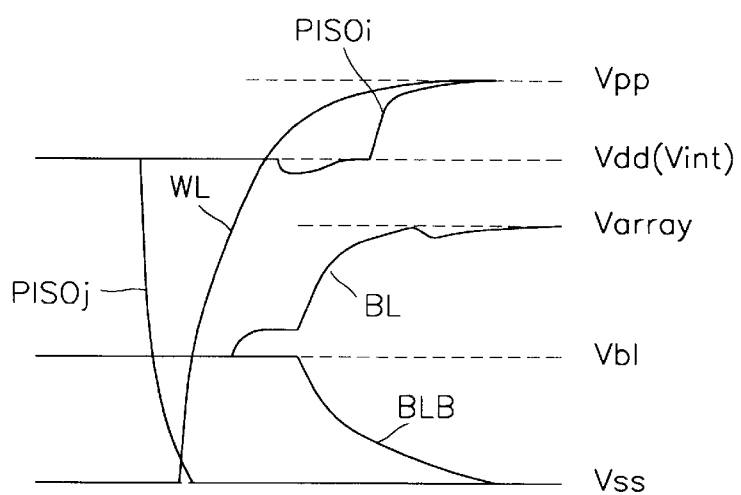
FIG. 9 is a timing diagram that illustrates operation of the DRAM device of FIG. 4.

FIG. 8 shows an example of the timing of the signals shown in FIG. 7, and FIG. 9 is a waveform diagram illustrating the operation of the sense amplifier in the DRAM device shown in FIG. 4. Referring to FIGS. 8 and 9, the operation of the isolation control circuit shown in FIG. 7 and of the sense amplifiers shown in FIG. 4 will now be explained more specifically.

At the initial stage, the control signals BLEQj, BLSiDP, BLEQi and BLSjDP are logic "low", logic "high", logic "low" and logic "high", respectively. As a result, the nMOS transistor N5 and the pMOS transistor P4 are turned on, so that the first isolation control signal PISOi is at the outside power supply voltage level Vdd, and the nMOS transistor N8 and the pMOS transistor P6 are turned on, so that the second isolation control signal PISOj is also at the outside power supply voltage level Vdd. Thus, during the initial operation of the sense amplifiers S1 through S4, the first or second isolation control signal PISOi or PISOj, which are held at the outside power supply voltage Vdd level, is provided together with the memory cell array power supply voltage Varray to the power supply voltage node LA of the sense amplifiers S1 through S4.

As shown in FIG. 8, the first and second isolation control signals PISOi and PISOj may be switched to a set-up voltage level Vpp and the ground voltage level Vss when the control signals BLEQj, BLSjDP, BLSiDP and BLEQi are maintained to be logic "low", logic "high", logic "low" and logic "high", respectively.

As described above, during the initial operation of the sense amplifiers S1 through S4, the isolation control signal PISOi or PISOj at the external power supply voltage level Vdd is provided together with the memory cell array power supply voltage level Varray to the power supply voltage node LA of the sense amplifiers S1 through S4. Accordingly, in the DRAM according to the present invention, the operation of the sense amplifiers S1 through S4 can be enhanced even if the memory cell array power supply voltage Varray becomes low (see FIG. 9). In other words, the power supply voltage level of the pair of bit lines BL/BLB can be amplified rapidly and completely.

The isolation control signal PISOi or PISOj having the outside power supply voltage Vdd level can be continuously provided to the power supply voltage node LA of the sense amplifiers S1 through S4 until the level of bit line BL reaches Vdd-Vthn. In the event that the level of the bit-line BL is beyond the above level, the nMOS transistors SW3 and SW4 are automatically turned off, thereby preventing an excessive rise in the level of the bit line BL. Here, Vthn denotes the threshold voltage of the nMOS transistors SW3 and SW4.

Accordingly, as described above with respect to FIGS. 4–9, methods of operating integrated circuit devices, such as multi-bank memory devices having multiple memory arrays therein, preferably include driving a power supply terminal LA of a differential sense amplifier (e.g., S1) with a plurality of pull-up drive currents derived from a corresponding plurality of signal lines. These signal lines, which are electrically coupled (e.g., by MOS pull-up transistors) to the power supply terminal LA of the differential sense amplifier S1, are driven at different positive voltage levels (Varray and (PISOi or PISOj)) during a sense and amplify time interval. These operations are performed by control circuitry that drives a power supply terminal LA of a differential sense amplifier (e.g., S1) with a plurality of pull-up drive currents derived from a corresponding plurality of signal lines (e.g., Varray and (PIOSi or PIOSj)) that are each electrically coupled to the power supply terminal LA of the differential sense amplifier (e.g, S1) and driven at different positive voltage levels during a sense and amplify time interval. This control circuit preferably includes a control signal generation circuit 47, an isolation control circuit 45 and MOS transistors SW1–SW4.

As illustrated by FIG. 4, an integrated circuit memory device may include a sense amplifier S1 having first and second inputs electrically coupled to a pair of differential signal lines. These differential signal lines may extend between current carrying terminals (e.g., source/drain regions) of a first pair of isolation transistors (e.g., T1 and T2) associated with a first memory cell array 41 and current carrying terminals of a second pair of isolation transistors (T9 and T10) associated with a second memory cell array 43. A pull-up control circuit is included that provides pull-up drive currents in parallel from first and second voltage supply sources having different magnitudes to a power supply terminal LA of the sense amplifier S1 when the sense amplifier is amplifying a differential input signal established across the first and second inputs. The pull-up control circuit may comprise a control signal generation circuit 47 and a plurality of switches (shown as SW1, SW3–SW4). The pull-up control circuit may also be configured to include an isolation control circuit 45.

The integrated circuit memory device of FIGS. 4–5 and 7 may also be treated as including a sense amplifier (S1) having first and second inputs electrically coupled to a pair of differential signal lines. A first memory cell array 41 may be provided having a first pair of bit lines (BL0*i*, BL0B*i*) electrically coupled thereto. A first pair of isolation transistors (T1, T2) is provided. These isolation transistors T1 and T2 have a first pair of current carrying terminals that are electrically coupled to the pair of differential signal lines, a second pair of current carrying terminals that are electrically coupled to the first pair of bit lines (BL0*i*/BL0B*i*) and a pair of gate electrodes that are responsive to a first isolation control signal (PISOi) provided on a first isolation control signal line (PISOi). A first bit line equalization circuit (E1) is also provided. The first bit line equalization circuit is electrically coupled to the first pair of bit lines (BL0*i*/ BL0B*i*) and is responsive to a first equalization signal (PEQi) provided on a first equalization signal line (PEQi). The memory device may also include a second memory cell array having a second pair of bit lines electrically coupled thereto. A second pair of isolation transistors is provided. This second pair of isolation transistors has a first pair of current carrying terminals that are electrically coupled to the pair of differential signal lines, a second pair of current carrying terminals that are electrically coupled to the second pair of bit lines and a pair of gate electrodes that are responsive to a second isolation control signal (PISOj) provided on a second isolation control signal line (PISOj). A second bit line equalization circuit (E5) is provided. This circuit (E5) is electrically coupled to the second pair of bit lines (BL0*j*/BL0B*j*) and is responsive to a second equalization signal (PEQj) provided on a first equalization signal line (PEQj).

A pull-up control circuit according to a preferred aspect of the present invention is also provided. The control circuit provides pull-up drive currents in parallel from first and second voltage supply sources having different magnitudes to a power supply terminal (LA) of the sense amplifier (S1) when the sense amplifier (S1) is amplifying a differential input signal established across the first and second inputs. The pull-up control circuit preferably includes a first MOS transistor (SW3) having a first current carrying terminal electrically coupled to the first isolation control signal line (PISOi) and a second current carrying terminal electrically coupled to the power supply terminal (LA) of the sense amplifier. The first MOS transistor (SW3) is shown as an NMOS transistor, however, the first MOS transistor (SW3) may also constitute a PMOS pull-up transistor. The pull-up control circuit also includes a second MOS transistor (SW1). This second MOS transistor has a first current carrying terminal electrically coupled to a memory array power supply line (Varray) and a second current carrying terminal electrically coupled to the power supply terminal of the sense amplifier. A third MOS transistor, which performs the function of a fourth switch SW4, has a first current carrying terminal electrically coupled to the second isolation control signal line (PISOj) and a second current carrying terminal electrically coupled to the power supply terminal of the sense amplifier.

The pull-up control circuit also preferably includes a control signal generation circuit 47. This control signal generation circuit 47 drives gate electrodes of the first and third MOS transistors (SW4, SW3) and is responsive to the first and second equalization signals (PEQi, PEQj). As illustrated best by FIG. 5, the control signal generation circuit 47 drives the gate electrode of the first MOS transistor (SW3) with an active signal (e.g., CNT1=1), subject to the constraint that the second equalization signal (PEQj) is active (e.g., PEQ;=1). The control signal generation circuit 47 also drives the gate electrode of the third MOS transistor (SW4) with an active signal (e.g., CNT2=1), subject to the constraint that the first equalization signal (PEQi) is active (e.g., PEQi=1).

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated circuit memory device, comprising:
   a sense amplifier having first and second inputs electrically coupled to a pair of differential signal lines;
   a pull-up control circuit that provides pull-up drive currents in parallel from first and second voltage supply sources having different magnitudes to a power supply terminal of said sense amplifier when said sense amplifier is amplifying a differential input signal established across the first and second inputs; and
   first and second isolation transistors having first and second gate electrodes electrically coupled to an isolation control signal line; and
   wherein said null-up control circuit comprises a first MOS transistor having a first current carrying terminal electrically coupled to the isolation control signal line and a second current carrying terminal electrically coupled to the rower supply terminal of said sense amplifier.

2. The memory device of claim 1, wherein said first and second isolation transistors have first current carrying terminals that are electrically coupled to the pair of differential signal lines.

3. The memory device of claim 2, wherein said pull-up control circuit further comprises:
   a second MOS transistor having a first current carrying terminal electrically coupled to a memory array power supply line and a second current carrying terminal electrically coupled to the power supply terminal of said sense amplifier.

4. The memory device of claim 3, wherein a magnitude of the first voltage supply source is greater than a magnitude of the second voltage supply source; wherein the isolation control signal line electrically connects the first current carrying terminal of said first MOS transistor to the first voltage supply source; and wherein the memory array power supply line electrically connects the first current carrying terminal of said second MOS transistor to the second voltage supply source.

5. The memory device of claim 2, further comprising:
   a memory cell array;
   a first pair of bit lines electrically coupled to said memory cell array and to second current carrying terminals of said first and second isolation transistors.

6. The memory device of claim 5, further comprising a first bit line equalization circuit that is electrically coupled to said first pair of bit lines and is responsive to a first equalization signal.

7. The memory device of claim 6, wherein said pull-up control circuit comprises a control signal generation circuit that drives a gate of said first MOS transistor and is responsive to the first equalization signal.

8. An integrated circuit memory device, comprising:
   a sense amplifier having first and second inputs electrically coupled to a pair of differential signal lines;
   a first memory cell array having a first pair of bit lines electrically coupled thereto;
   a first pair of isolation transistors having a first pair of current carrying terminal that are electrically coupled to the pair of differential signal lines, a second pair of current carrying terminals that are electrically coupled to the first pair of bit lines and a pair of gate electrodes that are responsive to a first isolation control signal provided on a first isolation control signal line;
   a first bit line equalization circuit that is electrically coupled to the first pair of bit lines and is responsive to a first equalization signal provided on a first equalization signal line;
   a second memory cell array having a second pair of bit lines electrically coupled thereto;
   a second pair of isolation transistors having a first pair of current carrying terminal that are electrically coupled to the pair of differential signal lines, a second pair of current carrying terminals that are electrically coupled to the second pair of bit lines and a pair of gate electrodes that are responsive to a second isolation control signal provided on a second isolation control signal line;
   a second bit line equalization circuit that is electrically coupled to the second pair of bit lines and is responsive to a second equalization signal provided on a first equalization signal line; and
   a pull-up control circuit that provides pull-up drive currents in parallel from first and second voltage supply sources having different magnitudes to a power supply terminal of said sense amplifier when said sense amplifier is amplifying a differential input signal established across the first and second inputs; wherein said pull-up control circuit comprises:
   a first MOS transistor having a first current carrying terminal electrically coupled to the first isolation control signal line and a second current carrying terminal electrically counled to the power supply terminal of said sense amplifier;
   a second MOS transistor having a first current carrying terminal electrically coupled to a memory array power supply line and a second current carrying terminal electrically counled to the power supply terminal of said sense amplifier; and
   a third MOS transistor having a first current carrying terminal electrically coupled to the second isolation control signal line and a second current carrying terminal electrically coupled to the power supply terminal of said sense amplifier.

9. The memory device of claim 8, wherein said pull-up control circuit further comprises:
   a control signal generation circuit that drives gate electrodes of said first and third MOS transistors and is responsive to the first and second equalization signals.

10. The memory device of claim 9, wherein said control signal generation circuit drives the gate electrode of said first MOS transistor with an active signal, subject to the constraint that the second equalization signal is active, and drives the gate electrode of said third MOS transistor with an active signal, subject to the constraint that the first equalization signal is active.

11. An integrated circuit memory device, comprising:
    a differential sense amplifier; and
    a control circuit that drives a positive power supply terminal of said differential sense amplifier with a boosted voltage level that is also provided to a gate electrode of an isolation transistor having a first current carrying terminal electrically coupled to an input of said differential sense amplifier.

12. An integrated circuit device, comprising:
    a differential sense amplifier having first and second inputs electrically coupled to a pair of differential signal lines;
    a pair of isolation transistors having first current carrying terminals electrically coupled to the pair of differential signal lines; and a switch electrically coupled between a gate of at least one of said pair of isolation transistors and a power supply terminal of said differential sense amplifier.

13. A semiconductor memory device comprising:
a memory cell array block;
a pair of bit lines connected to the memory cell array block;
a sense amplifier for sensing and amplifying a voltage difference between the pair of the bit lines;
a pair of isolation transistors for connecting the pair of bit lines and the sense amplifiers or isolating them from each other in response to an isolation control signal;
a first switch for transmitting a memory cell array power supply voltage to a power supply voltage node of the sense amplifiers in response to a sense amplifier control signal; and
a second switch for transmitting the isolation control signal to the power supply voltage node of the sense amplifier in response to a predetermined control signal,
wherein the memory cell array power supply voltage and the isolation control signal are used as power supply voltages of the sense amplifiers.

14. The semiconductor memory device as claimed in claim 13, wherein the second switch comprises an NMOS transistor.

15. The semiconductor memory device as claimed in claim 13, wherein the second switch comprises a PMOS transistor.

16. A semiconductor memory device comprising:
a first memory cell array block;
a pair of first bit lines connected to the first memory cell array block;
a second memory cell array block;
a pair of second bit lines connected to the second memory cell array block;
a sense amplifier for sensing and amplifying a voltage difference between the pair of first or second bit lines;
a pair of first isolation transistors for connecting the pair of first bit lines and the sense amplifiers or isolating them from each other in response to a first isolation control signal;
a pair of second isolation transistors for connecting the pair of second bit lines and the sense amplifiers or isolating them from each other in response to a second isolation control signal;
a first switch for transmitting the memory cell array power supply voltage to the power supply voltage node of the sense amplifier in response to a sense amplifier control signal;
a second switch for transmitting the first isolation control signal to the power supply voltage node of the sense amplifier in response to a first control signal; and
a third switch for transmitting the second isolation control signal to the power supply voltage node of the sense amplifier in response to a second control signal,
wherein any one of the first isolation control signal and the second isolation control signal, as well as the memory cell array power supply voltage, is used as a power supply voltage of the sense amplifier.

17. The semiconductor memory device as claimed in claim 16, further comprising:
a first equalization unit for equalizing the pair of first bit lines in response to a first equalization signal;
a second equalization unit for equalizing the pair of second bit lines in response to a second equalization signal;
a first control signal generation circuit for generating the first control signal in response to the sense amplifier control signal, an inverted signal of the sense amplifier control signal and the second equalization signal; and
a second control signal generation circuit for generating the second control signal in response to the sense amplifier control signal, the inverted signal of the sense amplifier control signal and the first equalization signal.

18. The semiconductor memory device as claimed in claim 17, wherein the second and third switches comprise nMOS transistors.

19. The semiconductor memory device as claimed in claim 18, wherein the first control signal generation circuit comprises:
a pMOS transistor in which the second equalization signal is applied to any one of the source or drain, the sense amplifier control signal is applied to the gate and any one of the source or drain is connected to an output node for generating the first control signal;
a first nMOS transistor in which the second equalization signal is applied to any one of the source or drain, the inverted signal of the sense amplifier control signal is applied to the gate and any one of the source or drain is connected to the output node; and
a second nMOS transistor in which any one of the source or drain is connected to the output node, the sense amplifier control signal is applied to the gate and a ground voltage is applied to any one of the source or drain.

20. The semiconductor memory device as claimed in claim 16, wherein the second control signal generation circuit comprises:
a pMOS transistor in which the first equalization signal is applied to any one of the source or drain, the sense amplifier control signal is applied to the gate and any one of the source or drain is connected to an output node for outputting the second control signal;
a first nMOS transistor in which the first equalization signal is applied to any one of the source or drain, the inverted signal of the sense amplifier control signal is applied to the gate and any one of the source or drain is connected to the output node; and
a second nMOS transistor in which any one of the source or drain is connected to the output node, the sense amplifier control signal is applied to the gate and the ground voltage is applied to any one of the source or drain.

21. The semiconductor memory device as claimed in claim 17, wherein the second and third switches comprise pMOS transistors.

22. A semiconductor memory device comprising:
a first memory cell array block;
a pair of first bit lines connected to the first memory cell array block;
a second memory cell array block;
a pair of second bit lines connected to the second memory cell array block;
a first equalization unit for equalizing the pair of first bit lines in response to the first equalization signal;
a second equalization unit for equalizing the pair of second bit lines in response to the second equalization signal;
a sense amplifier for sensing and amplifying a voltage difference between the pair of the first bit lines or the pair of the second bit lines;
a pair of first isolation transistors for connecting the pair of first bit lines and the sense amplifier or separating the pairs of first bit lines from the pair input by the sense amplifier in response to a first isolation control signal;

a pair of second isolation transistors for connecting the pair of the second bit lines and the sense amplifier or isolating them from each other in response to a second isolation control signal;

a first switch for transmitting the memory cell array power supply voltage to the power supply voltage node of the sense amplifier in response to the sense amplifier control signal;

a second switch for transmitting the first isolation control signal to the power supply voltage node of the sense amplifier in response to a first control signal;

a third switch for transmitting the second isolation control signal to the power supply voltage node of the sense amplifier in response to the second control signal; and a control signal generation circuit for generating the first and second control signals in response to the sense amplifier control signal, the inverted signal of the sense amplifier control signal and the first and second equalization signals.

23. The semiconductor memory device as claimed in claim 22, wherein the control signal generation circuit comprises:

a first control signal generation circuit for generating the first control signal in response to the sense amplifier control signal, the inverted signal of the sense amplifier control signal and the second equalization signal; and a second control generation circuit for generating the second control signal in response to the sense amplifier control signal, the inverted signal of the sense amplifier control signal and the first equalization signal.

24. The semiconductor memory device as claimed in claim 23, wherein the second and third switches comprise nMOS transistors.

25. The semiconductor memory device as claimed in claim 24, wherein the first control signal generation circuit comprises:

a pMOS transistor in which the second equalization signal is applied to any one of the source or drain, the sense amplifier control signal is applied to the gate and any one of the source or drain is connected to an output node for outputting the first control signal;

a first nMOS transistor in which the second equalization signal is applied to any one of the source or drain, the inverted signal of the sense amplifier control signal is applied to the gate and any one of the source or drain is connected to the output node; and a second nMOS transistor in which any one of the source or drain is connected to the output node, the sense amplifier control signal is applied to the gate and the ground voltage is applied to any one of the source or drain.

26. The semiconductor memory device as claimed in claim 24, wherein the second control signal generation circuit comprises:

a pMOS transistor in which the first equalization signal is applied to any one of the source or drain, the sense amplifier control signal is applied to the gate and any one of the source or drain is connected to an output node for outputting the second control signal;

a first nMOS transistor in which the first equalization signal is applied to any one of the source or drain, the inverted signal of the sense amplifier control signal is applied to the gate and any one of the source or drain is connected to the output node; and a second nMOS transistor in which any one of the source or drain is connected to the output node, the sense amplifier control signal is applied to the gate and the ground voltage is applied to any one of the source or drain.

27. The semiconductor memory device as claimed in claim 23, wherein the second and third switches comprise pMOS transistors.

* * * * *

UNITED STATES PATENT AND TRADEMARK OFFICE
CERTIFICATE OF CORRECTION

PATENT NO.    : 6,661,714 B2
DATED         : December 9, 2003
INVENTOR(S)   : Jae-Goo Lee It is certified that error appears in the above-identified patent and that said Letters Patent is hereby corrected as shown below:

<u>Column 11,</u>
Line 14, change "null" to -- pull --.
Line 18, change "rower" to -- power --.

Signed and Sealed this

Twentieth Day of April, 2004

JON W. DUDAS
*Acting Director of the United States Patent and Trademark Office*